United States Patent
Wakchaure et al.

(10) Patent No.: US 10,817,180 B2
(45) Date of Patent: *Oct. 27, 2020

(54) METHODS AND APPARATUS TO CONFIGURE PERFORMANCE OF A SOLID STATE DRIVE BASED ON HOST WRITE BANDWIDTH

(71) Applicant: Intel Corporation, Santa Clara, CA (US)

(72) Inventors: Yogesh B. Wakchaure, Folsom, CA (US); Xin Guo, San Jose, CA (US); David J. Pelster, Longmont, CO (US); Eric L. Hoffman, Lafayette, CO (US)

(73) Assignee: Intel corporation, santa clara, CA (US)

( * ) Notice: Subject to any disclaimer, the term of this patent is extended or adjusted under 35 U.S.C. 154(b) by 22 days.

This patent is subject to a terminal disclaimer.

(21) Appl. No.: 16/113,804

(22) Filed: Aug. 27, 2018

(65) Prior Publication Data

US 2019/0065057 A1 Feb. 28, 2019

Related U.S. Application Data

(63) Continuation of application No. 14/866,192, filed on Sep. 25, 2015, now Pat. No. 10,061,516.

(51) Int. Cl.
*G06F 12/00* (2006.01)
*G06F 3/06* (2006.01)
(Continued)

(52) U.S. Cl.
CPC .............. *G06F 3/061* (2013.01); *G06F 3/064* (2013.01); *G06F 3/0655* (2013.01);
(Continued)

(58) Field of Classification Search
CPC ........ G06F 3/061; G06F 3/064; G06F 3/0679; G06F 12/0246; G06F 3/0655; G06F 3/0688; G06F 2212/1016; G06F 2212/7202; G11C 11/5628; G11C 16/10; G11C 16/20; G11C 2211/5641; G11C 16/0483

See application file for complete search history.

(56) References Cited

U.S. PATENT DOCUMENTS

| 8,391,061 B2 | 3/2013 | Elmhurst et al. |
| 10,061,516 B2 | 8/2018 | Wakchaure |

(Continued)

OTHER PUBLICATIONS

International Seraching Authority, "International Search Report and Written Opinion," issued in connection with Application No. PCT/US2016/04826 dated Dec. 2, 2016, 14 pages.

(Continued)

*Primary Examiner* — Mark A Giardino, Jr.
(74) *Attorney, Agent, or Firm* — Hanley, Flight & Zimmerman, LLC

(57) ABSTRACT

An example apparatus includes a non-volatile memory including a first memory having a first write rate and a second memory having a second write rate, the first write rate greater than the second write rate An example controller is to determine, based on a ratio, a first portion of the data to be written to the first memory, and a second portion of the data to be written to the second memory type, the second portion of the data not included in the first portion of the data.

19 Claims, 5 Drawing Sheets

(51) Int. Cl.
*G06F 12/02* (2006.01)
*G11C 11/56* (2006.01)
*G11C 16/10* (2006.01)
*G11C 16/20* (2006.01)
*G06F 13/00* (2006.01)
*G06F 13/28* (2006.01)
*G11C 16/04* (2006.01)

(52) U.S. Cl.
CPC .......... *G06F 3/0679* (2013.01); *G06F 3/0688* (2013.01); *G06F 12/0246* (2013.01); *G11C 11/5628* (2013.01); *G11C 16/10* (2013.01); *G11C 16/20* (2013.01); *G06F 2212/1016* (2013.01); *G06F 2212/7202* (2013.01); *G11C 16/0483* (2013.01); *G11C 2211/5641* (2013.01)

(56) References Cited

U.S. PATENT DOCUMENTS

| | | |
|---|---|---|
| 2008/0215801 A1 | 9/2008 | Tan et al. |
| 2010/0169541 A1 | 7/2010 | Freikom |
| 2010/0318749 A1 | 12/2010 | Matthews |
| 2011/0080789 A1 | 4/2011 | Kalavade et al. |
| 2012/0284574 A1 | 11/2012 | Avila et al. |
| 2013/0173844 A1 | 7/2013 | Chen et al. |
| 2013/0254458 A1 | 9/2013 | Pittelko |
| 2013/0318289 A1 | 11/2013 | Tomlin |
| 2015/0095736 A1* | 4/2015 | Leem .................. G06F 11/1012 714/758 |
| 2016/0077968 A1 | 3/2016 | Sela et al. |

OTHER PUBLICATIONS

Intel, "Intel Solid-State Drives in Server Storage Application", Feb. 2014, 24 pages.

Yu Cai, Erich F. Haratsch, Onur Mutlu, Ken Mai, "Threshold Voltage Distribution in MLC NAND Flash Memory: Characterization, Analysis and Modeling," Proceedings of the Conference on Design, Automation & Test in Europe, (2013), ISBN: 978-1-45032153-2, 6 pages.

The United States Patent and Trademark Office, "Final Office Action," issued in connection with U.S. Appl. No. 14/866,192, dated Mar. 6, 2017, 11 pages.

The United States Patent and Trademark Office, "Non-Final Office Action," issued in connection with U.S. Appl. No. 14/866,192, dated Dec. 26, 2017, 9 pages.

The United States Patent and Trademark Office, "Notice of Allowance and Fee(s) Due," issued in connection with U.S. Appl. No. 14/866,192, dated Apr. 25, 2018, 6 pages.

* cited by examiner

METHODS AND APPARATUS TO CONFIGURE PERFORMANCE OF A SOLID STATE DRIVE BASED ON HOST WRITE BANDWIDTH

RELATED APPLICATION

This patent arises from a continuation of U.S. patent application Ser. No. 14/866,192, filed on Sep. 25, 2015, and entitled "METHODS AND APPARATUS TO CONFIGURE PERFORMANCE OF A SOLID STATE DRIVE BASED ON HOST WRITE BANDWIDTH." U.S. patent application Ser. No. 14/866,192 is hereby incorporated herein by reference in its entirety. Priority to U.S. application Ser. No. 14/866,192 is hereby claimed.

FIELD OF THE DISCLOSURE

This disclosure relates generally to solid state drives and, more particularly, to methods and apparatus to configure performance of a solid state drive based on host write bandwidth.

BACKGROUND

Computing systems write data to non-volatile memories for storage. Over time, new memory technologies have become available that enable faster reading and/or writing of data, increased data stability, increased data density, etc. Solid state drives (SSDs) utilize non-volatile memories to store data. NAND flash memory is a type of non-volatile memory that may be included in an SSD to store data.

BRIEF DESCRIPTION OF THE DRAWINGS

Some of the figures are not to scale. Wherever possible, the same reference numbers will be used throughout the drawing(s) and accompanying written description to refer to the same or like parts.

DETAILED DESCRIPTION

Figure 1:
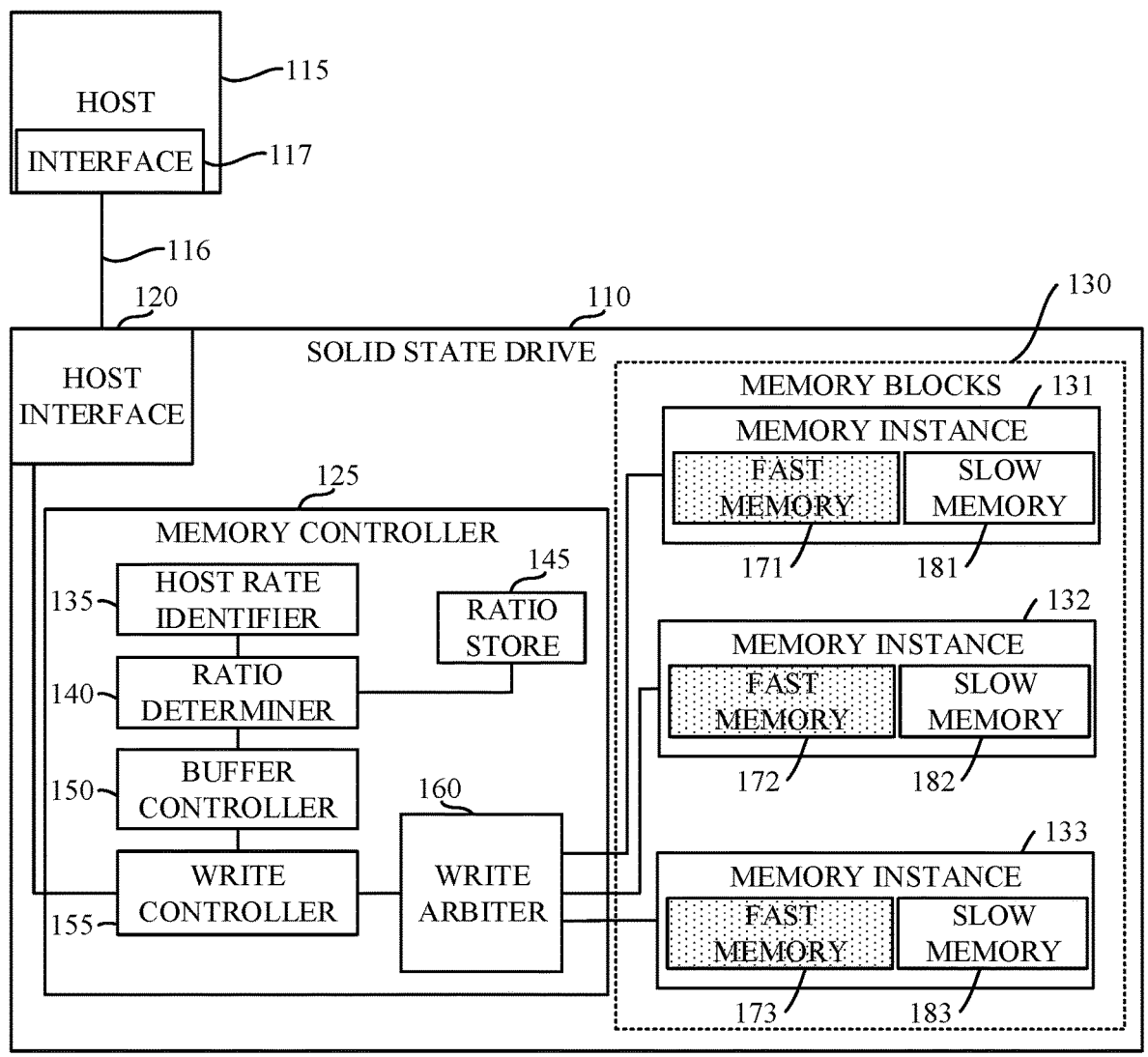
FIG. 1 is a block diagram illustrating an example solid state drive within an example environment of use.

NAND flash memories may be implemented to store one bit per cell (1 bpc) such as a single level cell (SLC) memory. Some NAND flash memories such as multi-level cell (MLC) memories are implemented to store multiple bits per cell (e.g., 2 bpc, 3 bpc, etc.) In some examples, MLC mode NAND flash memories that store three bits of data per cell are referred to as Triple Level Cell (TLC) memories. In some examples, MLC mode NAND flash memories that store four bits of data per cell are referred to as Quad Level Cell (QLC) memories. As used herein, MLC mode NAND flash memories are hereby defined to include 2 bpc MLC mode, TLC mode, and QLC mode memories. MLC NAND enables greater data density (e.g., multiple bits of data per cell) than SLC memories, but MLC NAND flash memories also take longer to write the same data as compared to SLC memories due to, for example, a number of program pulses needed to program a cell to a threshold voltage and/or a number of program verifies needed to verify a correct threshold voltage. As a result, SLC memories can be written approximately seven to eight times faster than MLC memories.

Some solid state drives include memories that are backwards compatible and, for example, may be able to operate in a lower density mode of operation. For example, a 2 bpc MLC memory may be operated in an SLC mode where each cell stores one bit (with a state represented by one of two logic levels (0 or 1)). In some SSDs, a first region of the memory is a first memory type that operates at a first write speed (e.g., in an SLC mode), and a second region of the memory is a second memory type that operates at a second write speed less than the first write speed (e.g., in an MLC mode). To accommodate periods where large amounts of data are to be written (e.g., a burst of host writes are requested by a host), SSDs first write data to the first region and queue the data written to the first region to be written to the second region. When the first region is full, subsequent incoming data is written to the second region. Such an approach boosts the effective host write speed as a result of the first region being operated at a greater bandwidth than the second region. However, such an approach also results in a much lower effective write speed once the first region of the memory is full. An example diagram illustrating the performance of the SSD using this approach is described below in connection with FIG. 2. Such an approach results in two fixed write speeds being available to the host (e.g., one write speed associated with writing to the first region and another write speed associated with writing to the second region once the first region is full.)

In many cases, the write speed offered by the first region (e.g., SLC memories) is greater than a rate at which the host can provide data (e.g., via a Parallel Advanced Technology Attachment (PATA) interconnect developed by the American National Standards Institute (ANSI) as standard no. X3.221-1994, a Serial Advanced Technology Attachment (SATA) interconnect developed by the Serial ATA International Organization (Serial ATA Revision 3.0), a Small Computer System Interface (SCSI) interconnect, a Serial-Attached SCSI (SAS) interconnect developed by the T10 group as standards document InterNational Committee for Information Technology Standards (INCITS) 534, Peripheral Component Interconnect (PCI) express (PCIe) interconnect developed by the PCI Special Interests Group (PCI-SIG) as the PCI Express Base Specification (current revision 3.1), a Non-Volatile Memory (NVMe) interconnect developed by the NVM Express, Inc. (current revision 1.2), etc. For example, some memories (e.g., SLC memories) may be able to be written at a rate of six Gigabytes per second, whereas a host interface may only be able to communicate data to be written at a rate of three Gigabytes per second (e.g., corresponding to a three Gigabytes per second SATA interconnect). As a result, data may unnecessarily be written to the first region (e.g., the SLC region) simply because the first region is not yet full.

In examples disclosed herein, a performance of the SSD is set such that a first portion of the write requests received from the host are written to the first region of the memory while the remainder of the write requests received at the SSD are written to the second region of the memory. By dividing some of the data to be written between the first region and the second region, the effective write speed performance of the SSD is reduced. In many cases, the reduction in effective performance still results in an effective level of performance that is greater than or equal to the write speed capabilities of the host (e.g., the effective write speed of the SSD may be greater than the three Gigabytes per second of a SATA interconnect). Moreover, as a result of directly writing some data during a period of increased performance (e.g., a period where some data is written to the first region of the memory) directly to the second region, the total amount of data written during the period of increased performance is increased.

Some memory technologies such as, for example, NAND flash memories, suffer from a phenomenon known as wear out. For example, NAND flash memories have an expected lifetime, which is measured as the number of times data can be written to the NAND cell before the cell is expected to fail. For example, a cell may be written to one hundred thousand times before the cell becomes worn out (e.g., fails due to electrical characteristics of the memory cell no longer being programmable to store different binary values). In SSDs, where data is frequently written to a first region of the memory (e.g., SLC memory), wear-out of the first region of the memory is a concern. In examples disclosed herein, by reducing the number of writes to the first region of the memory (e.g., the SLC memory), the effective lifetime (measured in time) of the first region of the memory (e.g., the SLC memory) is increased in comparison to the effective lifetime had all of the incoming data been written to the first region of the memory (e.g., the SLC memory).

FIG. 1 is a block diagram illustrating an example solid state drive (SSD) 110 within an example environment of use. The example SSD 110 communicates with a host 115 having an interface 117 via an interconnect 116. In examples disclosed herein, the SSD 110 includes a host interface 120 to send and/or receive data via the interconnect 116. When an example memory controller 125 of the SSD 110 receives data via the host interface 120, the example memory controller 125 stores the data in the memory blocks 130 (e.g., memory blocks in a NAND device). The example memory controller 125 includes a host rate identifier 135, a ratio determiner 140, a ratio store 145, a buffer controller 150, a write controller 155, and a write arbiter 160. The example memory blocks 130 include a memory instance 131, 132, 133. In the illustrated example of FIG. 1, three memory instances are shown. However, the example memory blocks 130 may include any number and/or type of memory instance. In examples disclosed herein, the memory instances 131, 132, 133 are implemented within a single memory block. As such, in some examples, a given memory block may include multiple memory instances. However, in some examples, the example memory instances 131, 132, 133 are implemented in separate memory blocks.

In examples disclosed herein, the example memory instances 131, 132, 133 are implemented as NAND flash memories. However, any other memory technology may additionally or alternatively be used such as, for example, NAND flash memory, NOR flash memory, 3-Dimensional crosspoint (3D—crosspoint) memory, ferroelectric memory, silicon-oxide-nitride-oxide-silicon (SONOS) memory, polymer memory such as ferroelectric polymer memory, ferroelectric transistor random access memory (FeTRAM or FeRAM), nanowire, phase change memory, phase change memory with switch, magnetoresistive random access memory (MRAM), spin transfer torque (STT), etc. Moreover, in some examples, different memory technologies may be used among the memory instances 131, 132, 133. For example, a first memory instance 131 may be implemented using a first memory technology while a second memory instance 132 may be implemented using a second memory technology different from the first memory technology.

In examples disclosed herein, the memory instances include fast memory 171, 172, 173 and slow memory 181, 182, 183. As used herein, "fast" and "slow" as used in connection with the fast memory 171, 172, 173, and the slow memory 181, 182, 183 refer to write speeds associated with the respective memory. In examples disclosed herein, each memory instance 131, 132, 133 is bandwidth limited in that each memory instance can operate on a single memory within the memory instance 131, 132, 133 at a given time. As such, when writing to the fast memory 171, 172, 173 within a memory instance 131, 132, 133, the slow memory 181, 182, 183 within that memory instance cannot be accessed. Likewise, when writing to the slow memory 181, 182, 183 within the memory instance 131, 132, 133, the fast memory 171, 172, 173 within that memory instance cannot be accessed.

In examples disclosed herein, the fast memory 171, 172, 173 is implemented by NAND flash memory operated in an SLC mode. In examples disclosed herein, the slow memory 181, 182, 183 is implemented by NAND flash memory operated in an MLC mode. In examples disclosed herein, each memory instance 131, 132, 133 includes both the fast memory 171, 172, 173 and the slow memory 181, 182, 183, according to a memory distribution. In some examples, the slow memory may represent ten percent of the total capacity of the SSD. In some examples, the slow memory may represent fifteen percent of the total capacity of the SSD. However, any other distribution may additionally or alternatively be used.

In examples disclosed herein, both the fast memory 171, 172, 173 and the slow memory 181, 182, 183 are implemented using a same memory technology (e.g., NAND flash memory), but are operated using different modes of operation within that same memory technology. However, in some examples, the example fast memory 171, 172, 173 and the example slow memory 181, 182, 183 may be implemented using different memory technologies (e.g., the fast memory 171, 172, 173 may be implemented using NAND flash memory operated in an SLC mode while the slow memory 181, 182, 183 may be implemented using a magnetic storage technology, the fast memory 171, 172, 173 may be implemented using 3D crosspoint memory while the slow memory 181, 182, 183 may be implemented using NAND flash memory).

The example host 115 of the illustrated example of FIG. 1 is a computing system. In some examples, the host 115 is implemented by a personal computer (e.g., a desktop computer, a laptop computer, etc.). However, the host 115 may be implemented any other hardware and/or software. For example, the host may be a smartphone, a television, a set top box, a printer, a home automation system, etc. That is, the host 115 may be any type of computing system capable of writing data to the SSD 110. In some examples, the example host 115 includes the interface 117 that communicates with the example host interface 120 of the SSD 110 using a Serial Advanced Technology Attachment (SATA) interconnect 116. However, any other type of communication interconnect or link may additionally or alternatively be used such as, for example, a Parallel Advanced Technology Attachment (PATA) interconnect, a Small Computer System Interface (SCSI) interconnect, a Serial-Attached SCSI (SAS) interconnect, Peripheral Component Interconnect (PCI) express (PCIe) interconnect, Non-Volatile Memory (NVMe) interconnect, etc.

The example host interface 120 of the illustrated example of FIG. 1 receives data to be written to the memory blocks 130 from the host 115. In examples disclosed herein, the example host interface 120 is implemented using a single SATA port. However, any other number and/or type of interface may additionally or alternatively be used. Data received by the example host interface 120 is forwarded to the example memory controller 125.

The example memory controller 125 of the illustrated example of FIG. 1 is implemented by a hardware processor (e.g., a silicon based processor). However, any other type of circuitry may additionally or alternatively be used such as, for example an analog or digital circuit(s), a logic circuit, a programmable processor(s), an application specific integrated circuit(s) (ASIC(s)), a programmable logic device(s) (PLD(s)) and/or field programmable logic device(s) (FPLD(s)). The example memory controller 125 of the illustrated example of FIG. 1 receives write requests from the host 115 via the host interface 120, and writes the requested data to the memory blocks 130. In examples disclosed herein, the memory controller 125 calculates a ratio representative of a percentage of data to be written to fast memory (e.g., SLC memory) of the SSD 110. Upon receipt of a write request including data to be written to the memory blocks 130, the example memory controller 125 determines, using the ratio, a first portion of the data to be written to the fast memory of the SSD 110. The example memory controller 125 determines, using the ratio, a second portion of the data to be written to slow memory (e.g., MLC memory) of the SSD 110. In examples disclosed herein, the second portion of the data is a remainder of the data not included in the first portion of the data. The example memory controller 125 then writes the first portion of the data to the fast memory, and writes the second portion of the data to the slow memory.

As noted above, the example memory controller 125 includes the example host rate identifier 135, the example ratio determiner 140, the example ratio store 145, the example buffer controller 150, the example write controller 155, and the example write arbiter 160.

The example host rate identifier 135 of the illustrated example of FIG. 1 identifies a desired host rate. In some examples, the host rate identifier 135 interacts with and/or monitors interactions of the host 115 to identify a level of capability of the host 115. For example, if communicating using a 3 Gigabyte per second SATA interface, the example host rate identifier may determine that the host 115 is capable of communicating data to be written to the SSD 110 at a rate of three Gigabytes per second. Additionally or alternatively, the example host rate identifier 135 may identify a desired host rate to be maintained by the SSD 110. In some examples, the host rate is determined periodically (e.g., once per hour, once per day, etc.). However, in some examples, the host rate is determined aperiodically or in response to a triggering event (e.g., when a connection is detected via the host interface 120, when a request to write data is received, at a time of manufacture of the SSD 110, when configured by a user of the SSD 110, etc.).

In some examples, the host rate is user configurable. As a result, users can select the desired level of performance of the SSD 110. That is, users can select if they would prefer to (1) have data written quickly for a short period of time before reverting to a slower write speed, or (2) have data written at an intermediate write speed but for a longer period of time before reverting to the slower write speed, or (3) any gradation there between. In some examples, the host rate is determined at a time of manufacture of the SSD 110. For example, a manufacturer of the SSD 110 may configure the desired host rate to control a maximum performance of the SSD 110. By configuring the desired host rate, the manufacturer may offer multiple different models of SSDs that have different performance characteristics, but are constructed using the same components. In such examples, the example host rate may be stored in a non-volatile memory of the SSD (e.g., the ratio store 145). However, the example host rate may be stored and/or configured in any other fashion. For example, the example host rate may be hard-coded into a firmware of the SSD, the example host rate may be stored in a volatile memory of the SSD 110, etc. If the host rate is stored in a volatile memory of the SSD 110, the example host rate may be, for example, retrieved from a non-volatile memory each time power is applied to the SSD, determined dynamically each time power is applied to the SSD, etc. In some examples, the example host rate may be communicated to the SSD 110 by the host 115 (e.g., using a SATA protocol) based on, for example, a user input.

The example ratio determiner 140 of the illustrated example of FIG. 1 calculates a ratio representative of a percentage of incoming data to be written to the fast memory. Alternatively, the ratio may be representative of a percentage of incoming data to be written to the slow memory. In the illustrated example, the ratio is determined using the following equation:

$$\frac{1}{P_{desired}} = \frac{x}{P_{Fast}} + \frac{1-x}{P_{Slow}}$$

Where x is the ratio, $P_{desired}$ is the desired host rate determined by the example host rate identifier 135, Fast is $P_{Fast}$ is the rate at which data is written to the fast memory, and $P_{Slow}$ is the rate at which data is written to the slow memory. For example, if the desired host rate were three Gigabytes per second ($P_{desired}$=3 GBps), the fast memory is written at a rate of six Gigabytes per second ($P_{Fast}$=6 GBps), and the slow memory is written at a rate of one Gigabyte per second ($P_{Slow}$=1 GBps), the calculated ratio would be:

$$\frac{1}{3} = \frac{x}{6} + \frac{1-x}{1}$$

In this example, the ratio is determined to be four fifths (i.e., 0.8). As a result, in such an example, four out of every five write requests are written to the fast memory (and one out of those five requests are written to the slow memory.) In some examples, rather than handling entire write requests, the write requests may be divided into portions of data to be written to the fast memory or the slow memory.

In some examples, additional thresholds and/or restrictions are placed on the desired host rate (e.g., desired write speed). For example, the host rate may be restricted to being less than or equal to the rate at which data can be written to the fast memory, as well as greater than or equal to the rate at which data can be written to the slow memory. Moreover, in some examples, the rate at which data can be written to the fast memory is restricted to being greater than or equal to the rate at which data can be written to the slow memory. Such example restrictions ensure that the resultant ratio is greater than or equal to zero, as well as less than or equal to one. If, for example, the ratio is calculated to be greater than one, the ratio may be set to one (i.e., to represent that data can be written no faster than the rate at which data can be written to the fast memory).

The example ratio determiner 140 of FIG. 1 calculates the ratio periodically (e.g., once per minute, once per hour, etc.). However, the example ratio determiner 140 may calculate the ratio aperiodically (e.g., upon demand, upon receipt of a write request, when power is applied to the SSD 110, during a boot procedure, etc.) Upon calculating the ratio, the example ratio determiner 140 stores the ratio in the ratio store 145. In some examples, the ratio store 145 may be implemented using a location within the memory blocks 130. However, in some examples, the ratio store 145 may be implemented using a memory of the solid state drive storing firmware and/or other configurable parameters.

The example ratio store 145 of the illustrated example of FIG. 1 stores the ratio calculated by the ratio determiner 140. In the illustrated example of FIG. 1, the example ratio store 145 is implemented using non-volatile memory (e.g., NAND flash memory). However, the example ratio store 145 may be implemented in any other fashion. For example, the example ratio store 145 may be implemented by a volatile memory (e.g., a Synchronous Dynamic Random Access Memory (SDRAM), Dynamic Random Access Memory (DRAM), RAMBUS Dynamic Random Access Memory (RDRAM, etc.) and/or a non-volatile memory (e.g., NAND flash memory, NOR flash memory, or any other type of non-volatile memory). The example ratio store 145 may additionally or alternatively be implemented using any suitable volatile memory such as Joint Electronic Device Engineering Council (JEDEC) standards based memories including one or more of DDR3 (dual data rate version 3, original release by JEDEC on Jun. 27, 2007, currently on release 21), DDR4 (DDR version 4, initial specification published in September 2012 by JEDEC), LPDDR3 (low power DDR version 3, JESD209-3B, August 2013 by JEDEC), LPDDR4 (LOW POWER DOUBLE DATA RATE (LPDDR) version 4, JESD209-4, originally published by JEDEC in August 2014), WIO2 (Wide I/O 2 (WideIO2), JESD229-2, originally published by JEDEC in August 2014), HBM (HIGH BANDWIDTH MEMORY DRAM, JESD235, originally published by JEDEC in October 2013), DDR5 (DDR version 5, currently in discussion by JEDEC), LPDDR5 (currently in discussion by JEDEC), WIO3 (Wide I/O 3, currently in discussion by JEDEC), HBM2 (HBM version 2), currently in discussion by JEDEC), and/or others, and technologies based on derivatives or extensions of such specification. While in the illustrated example the ratio store 145 is illustrated as a single memory, the ratio store 145 may be implemented by any number and/or type(s) of memories.

The example buffer controller 150 of the illustrated example of FIG. 1 controls re-writing data written to the fast memory 171, 172, 173 to the slow memory 181, 182, 183. In examples disclosed herein, during a bursty write period (e.g., a period where an above-average amount of data is to be written), data is quickly written to the fast memory 171, 172, 173 so that it can later be transferred to slow memory 181, 182, 183. In effect, the fast memory 171, 172, 173 is used as a temporary buffer for data that is ultimately to be written to the slow memory 181, 182, 183. In examples disclosed herein, the example buffer controller 150 queues data written to the fast memory 171, 172, 173 to be written to the slow memory 181, 182, 183 (e.g., once the bursty write period has ended). By queuing the subsequent write operations to write the data to the slow memory 181, 182, 183, the buffer controller 150 enables the fast memory 171, 172, 173 to be erased, thereby enabling future write requests to be written to the fast memory 171, 172, 173.

The example write controller 155 of the illustrated example of FIG. 1 receives requests to write data from the host 115. In response to receiving a request to write data, the example write controller 155 of FIG. 1 determines, based on the ratio calculated by the example ratio determiner 140, a first portion of the data to be written to the fast memory of the SSD 110. The example write controller 155 also determines, based on the ratio calculated by the example ratio determiner 140, a second portion of the data to be written to the slow memory of the SSD 110. In examples disclosed herein, the second portion of the data is a remainder of the data not included in the first portion of the data. In some examples, the example write controller 155 splits data of a single received write request into the first portion and the second portion. However, in some examples, the example write controller 155 splits data of multiple received write requests into the first portion and the second portion. For example, using the ratio of four fifths calculated by the example ratio determiner 140, the example write controller 155 may select four of every five requests as the first portion, and may select one of every five requests as the second portion.

The example write arbiter 160 of the illustrated example of FIG. 1 communicates data to be written to the memory instances 131, 132, 133. As noted above, when communicating with each memory instance, the write arbiter 160 performs a single write operation at a time with respect to each memory instance 131, 132, 133. As such, with respect to each memory instance 131, 132, 133, the example write arbiter 160 may either write the data to either the fast memory 171, 172, 173 or write the data to the slow memory 182, 182, 183.

Figure 2:
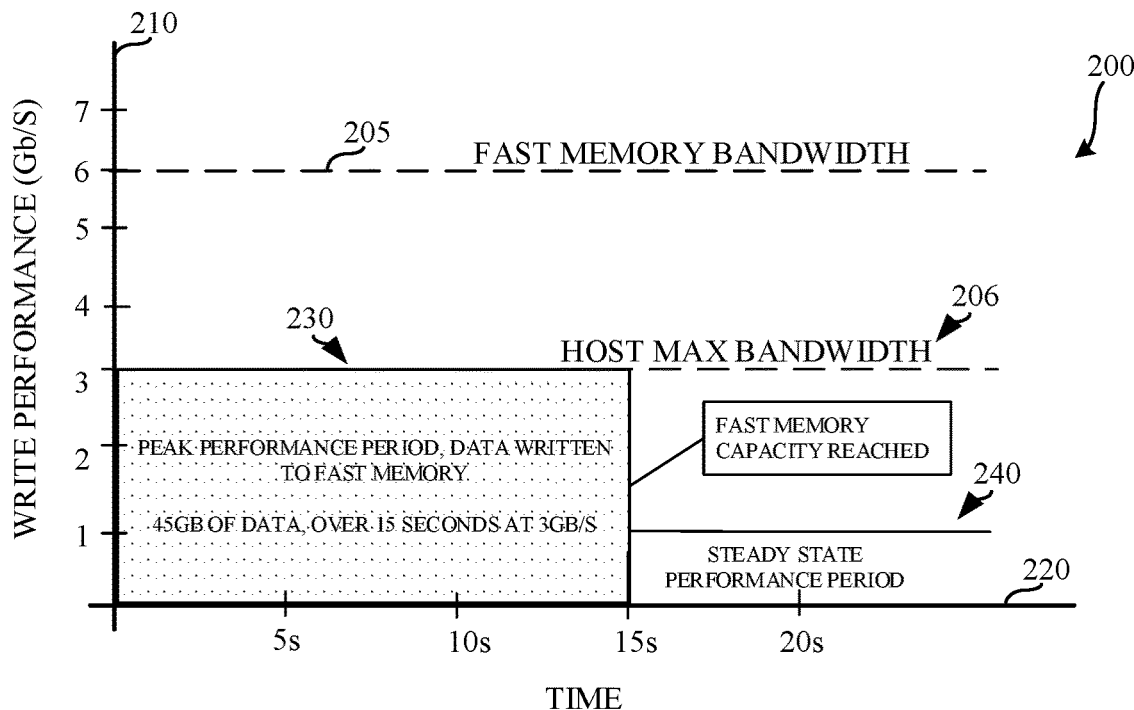
FIG. 2 is a performance diagram representing write performance of a solid state drive over time.

FIG. 2 is a performance diagram 200 representing write performance of a solid state drive over time. In the illustrated example of FIG. 2, write performance is represented using a vertical axis 210, and time is represented using a horizontal axis 220. In the illustrated example of FIG. 2, write performance indicated by the vertical axis 210 is measured in Gigabytes per second. However, any other approach to representing write performance may additionally or alternatively be used. In the illustrated example of FIG. 2, the horizontal axis 220 is represented using seconds. However, any other unit of time may additionally or alternatively be used.

The example diagram 200 of FIG. 2 represents an aggregate write performance of the SSD 110 over time. More particularly, the diagram 200 represents a scenario where data is constantly being written to the SSD 110. In the illustrated example of FIG. 2, an example fast memory bandwidth 205 is illustrated as six Gigabytes per second. In the illustrated example of FIG. 2, an example host maximum bandwidth 206 is illustrated as three Gigabytes per second. When the SSD 110 does not utilize the example approaches disclosed herein and, instead, attempts to first write all incoming data to the fast memory, the write performance of the SSD begins at a performance level representing the lesser of the bandwidth of the fast memory 205 or the maximum host bandwidth 206. During that peak performance time interval or period 230, the SSD 110 operates at a peak performance level (corresponding to the lesser of the bandwidth of the fast memory 205 or the maximum host bandwidth 206). In the illustrated example of FIG. 2, the fast memory has a capacity of 45 Gigabytes. As such, the peak performance time interval or period 230 lasts for fifteen seconds. After the peak performance period 230 (fifteen seconds in the illustrated example of FIG. 2), the fast memory becomes full, and any subsequent data is written to slow memory. When writing to the slow memory, the SSD 110 operates at a steady state performance level (corresponding to the write speed of the slow memory). The steady state performance period 240 continues until all data has been written. In the illustrated example of FIG. 2, the write performance during the peak performance period 230 is 3 GBps, whereas the write performance during the steady state performance period 240 is 1 GBps.

Figure 3:
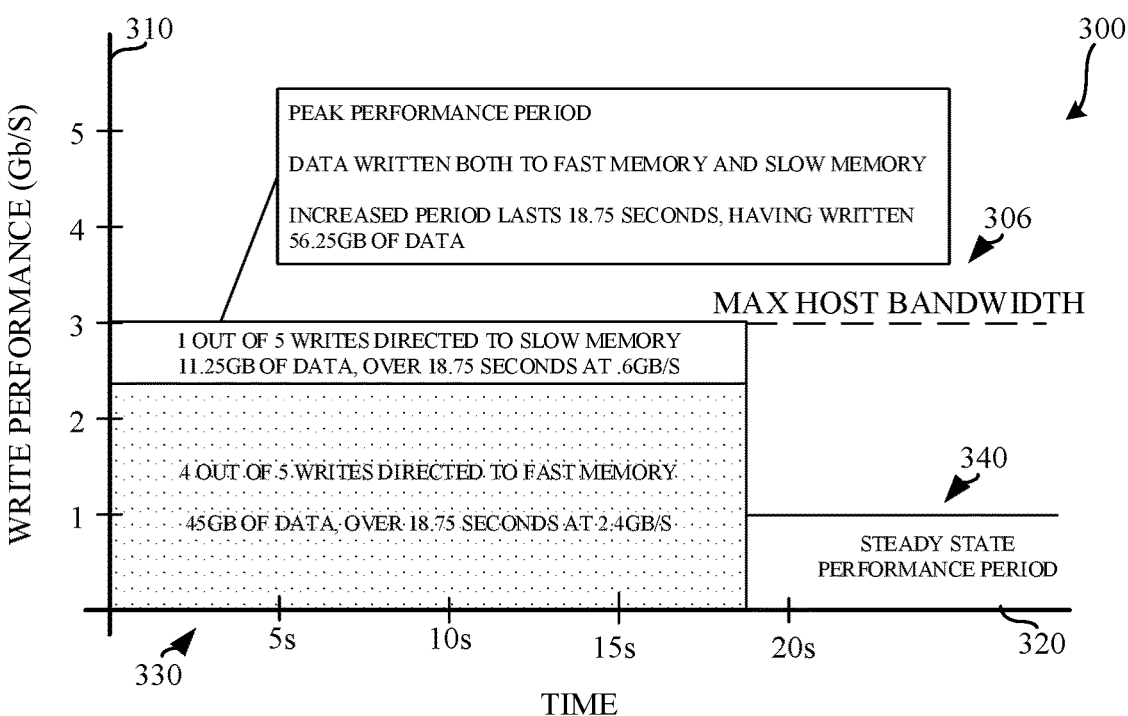
FIG. 3 is a performance diagram representing write performance of a solid state drive over time using the examples disclosed herein to extend a period of increased performance when writing data.

FIG. 3 is a performance diagram 300 representing write performance of a solid state drive over time using the examples disclosed herein to extend a period of increased performance when writing data. In the illustrated example of FIG. 3, write performance is represented using a vertical axis 310, and time is represented using a horizontal axis 320. In the illustrated example of FIG. 3, write performance indicated by the vertical axis 310 is represented in Gigabytes per second. However, any other approach to representing write performance may additionally or alternatively be used. In the illustrated example of FIG. 3, the time axis 320 is represented using seconds. However, any other unit of time may additionally or alternatively be used.

The example diagram 300 of FIG. 3 represents an aggregate write performance of the SSD 110 over time. As with FIG. 2, the example diagram 300 represents a scenario where data is constantly being written to the SSD 110. In the illustrated example of FIG. 3, an example fast memory bandwidth is six Gigabytes per second. In the illustrated example of FIG. 3, an example host maximum bandwidth 307 is illustrated as four Gigabytes per second. In the illustrated example of FIG. 3, an example host desired bandwidth 306 is illustrated as three Gigabytes per second. In the illustrated example of FIG. 3, the desired host bandwidth 306 is less than or equal to the host maximum bandwidth 307. When the SSD 110 implements the examples disclosed herein and selectively writes some portion of the incoming data directly to slow memory, the example write performance 330 results. The write performance 330 of the SSD 110 begins at a performance level representing the write speed of writing a first portion of the incoming data to fast memory and a second portion of the incoming data to slow memory. During this desired host bandwidth performance period 330, the SSD 110 operates at the desired host bandwidth performance level.

During the example desired host bandwidth performance period 330, four of every five write operations are directed to the fast memory, whereas one of every five writes are directed to the slow memory. The following equation may be used to determine an amount of time that data will be written when using the example approaches disclosed herein:

$$\text{Write Time} = C_{fast} \cdot \frac{1}{(x \cdot P_{desired})}$$

In the above example equation, Write Time represents the total amount of time that data will be written, Cfast represents the capacity of the fast memory, x represents the calculated ratio, and Pdesired represents the desired host rate. As a result, when written at a rate of 2.4 Gigabytes per second (reflecting the four out of five ratio with respect to the desired host rate of three Gigabytes per second), the example fast memory (which, in the illustrated example, has a capacity of forty five Gigabytes) will take eighteen and three quarter seconds to become full.

Moreover, during the example desired host performance period, one of every five write operations is directed to the slow memory. As a result, when written at a rate of 0.6 Gigabytes per second (e.g., the remainder between the desired host rate of 3 Gigabytes per second and the rate at which the fast memory is written of 2.4 Gigabytes per second), over the eighteen and three quarter second duration of the example desired host bandwidth performance period 330, eleven and one quarter Gigabyte will be written to the slow memory. At the end of the example desired host bandwidth performance period 330 (eighteen and three quarter seconds in the illustrated example of FIG. 3), the fast memory becomes full, and any subsequent data is written to slow memory.

When compared with the peak performance period 230 of FIG. 2, the example desired host bandwidth performance period 330 of FIG. 3 results in an increased duration by 3.75 seconds (e.g., twenty five percent). As such, the period of time during which data is written at an increased performance level is extended. Moreover, during the example desired host bandwidth performance period 330, a total of fifty six and one quarter Gigabytes of data are written (as compared to forty five Gigabytes of the peak performance period 230 of FIG. 2). As such, the amount of data written during the desired host bandwidth performance period 330 is increased.

While an example manner of implementing the example SSD 110 is illustrated in FIG. 1, one or more of the elements, processes and/or devices illustrated in FIG. 1 may be combined, divided, re-arranged, omitted, eliminated and/or implemented in any other way. Further, the example host interface 120, the example memory controller 125, the example host rate identifier 135, the example ratio determiner 140, the example ratio store 145, the example buffer controller 150, the example write controller 155, the example write arbiter 160, the example memory blocks 130, the example memory instances 131, 132, 133, the example fast memory 171, 172, 173, the example slow memory 181, 182, 183, and/or, more generally, the example SSD 110 of FIG. 1 may be implemented by hardware, software, firmware and/or any combination of hardware, software and/or firmware. Thus, for example, any of the example host interface 120, the example memory controller 125, the example host rate identifier 135, the example ratio determiner 140, the example ratio store 145, the example buffer controller 150, the example write controller 155, the example write arbiter 160, the example memory blocks 130, the example memory instances 131, 132, 133, the example fast memory 171, 172, 173, the example slow memory 181, 182, 183, and/or, more generally, the example SSD 110 of FIG. 1 could be implemented by one or more analog or digital circuit(s), logic circuits, programmable processor(s), application specific integrated circuit(s) (ASIC(s)), programmable logic device(s) (PLD(s)) and/or field programmable logic device(s) (FPLD(s)). When reading any of the apparatus or system claims of this patent to cover a purely software and/or firmware implementation, at least one of the example host interface 120, the example memory controller 125, the example host rate identifier 135, the example ratio determiner 140, the example ratio store 145, the example buffer controller 150, the example write controller 155, the example write arbiter 160, the example memory blocks 130, the example memory instances 131, 132, 133, the example fast memory 171, 172, 173, the example slow memory 181, 182, 183, and/or, more generally, the example SSD 110 of FIG. 1 is/are hereby expressly defined to include a tangible computer readable storage device or storage disk such as a memory, a digital versatile disk (DVD), a compact disk (CD), a Blu-ray disk, etc. storing the software and/or firmware. Further still, the example SSD 110 of FIG. 1 may include one or more elements, processes and/or devices in addition to, or instead of, those illustrated in FIG. 1, and/or may include more than one of any or all of the illustrated elements, processes and devices.

Figure 4:
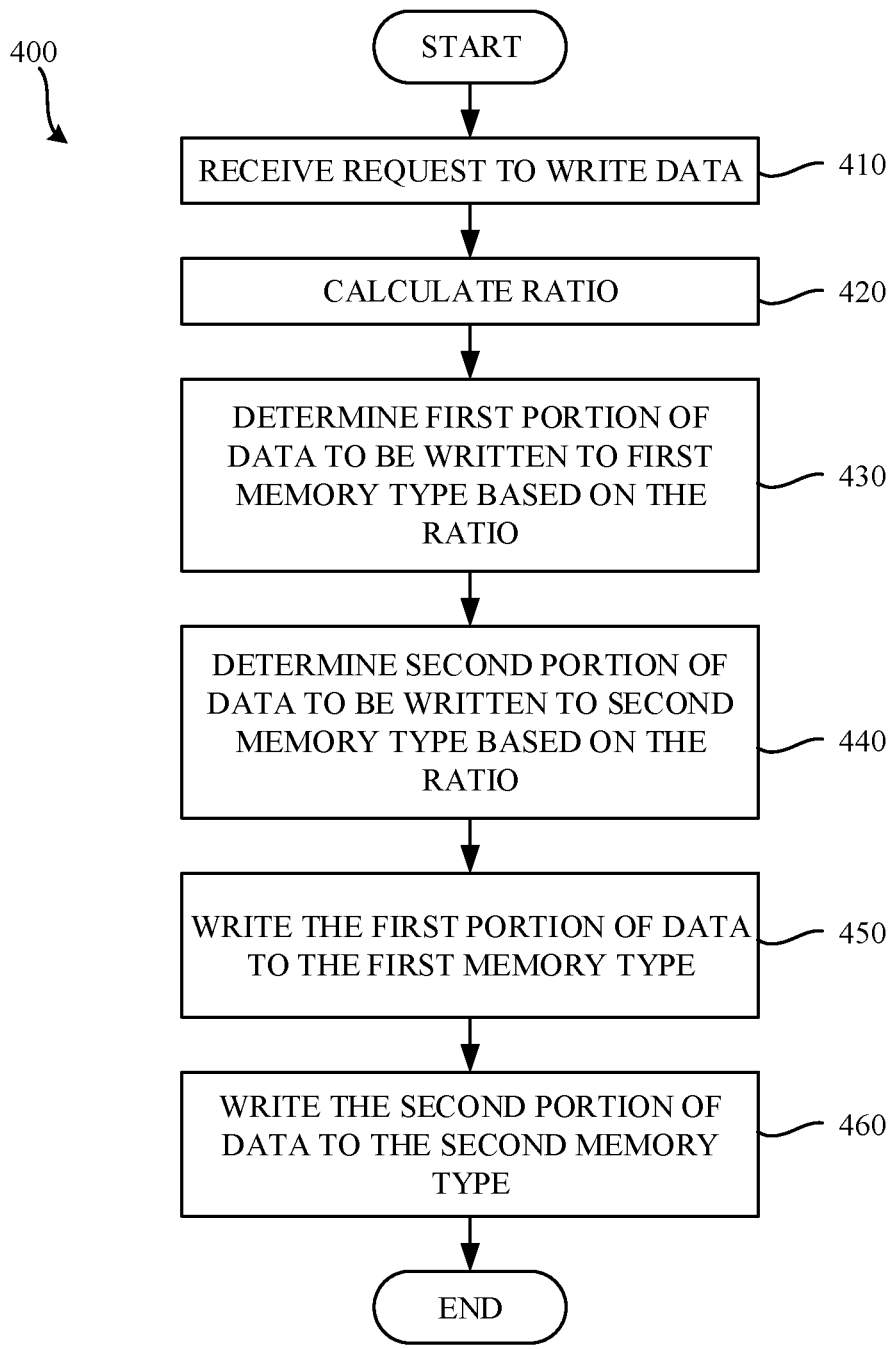
FIG. 4 is a flowchart representative of example machine-readable instructions which, when executed, cause the example solid state drive of FIG. 1 to extend a period of increased performance when writing data.

Flowcharts representative of example machine readable instructions for implementing the example SSD 110 of FIG. 1 are shown in FIGS. 4 and/or 5. In these example(s), the machine readable instructions comprise a program(s) for execution by a processor such as the processor 612 shown in the example processor platform 600 discussed below in connection with FIG. 6. The program may be embodied in software stored on a tangible computer readable storage medium such as a CD-ROM, a floppy disk, a hard drive, a digital versatile disk (DVD), a Blu-ray disk, or a memory associated with the processor 612, but the entire program and/or parts thereof could alternatively be executed by a device other than the processor 612 and/or embodied in firmware or dedicated hardware. Further, although the example program(s) is/are described with reference to the flowchart(s) illustrated in FIGS. 4 and/or 5, many other methods of implementing the example SSD 110 may alternatively be used. For example, the order of execution of the blocks may be changed, and/or some of the blocks described may be changed, eliminated, or combined.

As mentioned above, the example processes of FIGS. 4 and/or 5 may be implemented using coded instructions (e.g., computer and/or machine readable instructions) stored on a tangible computer readable storage medium such as a hard disk drive, a flash memory, a read-only memory (ROM), a compact disk (CD), a digital versatile disk (DVD), a cache, a random-access memory (RAM) and/or any other storage device or storage disk in which information is stored for any duration (e.g., for extended time periods, permanently, for brief instances, for temporarily buffering, and/or for caching of the information). As used herein, the term tangible computer readable storage medium is expressly defined to include any type of computer readable storage device and/or storage disk and to exclude propagating signals and transmission media. As used herein, "tangible computer readable storage medium" and "tangible machine readable storage medium" are used interchangeably. Additionally or alternatively, the example processes of FIGS. 4 and/or 5 may be implemented using coded instructions (e.g., computer and/or machine readable instructions) stored on a non-transitory computer and/or machine readable medium such as a hard disk drive, a flash memory, a read-only memory, a compact disk, a digital versatile disk, a cache, a random-access memory and/or any other storage device or storage disk in which information is stored for any duration (e.g., for extended time periods, permanently, for brief instances, for temporarily buffering, and/or for caching of the information). As used herein, the term non-transitory computer readable medium is expressly defined to include any type of computer readable storage device and/or storage disk and to exclude propagating signals and transmission media. As used herein, when the phrase "at least" is used as the transition term in a preamble of a claim, it is open-ended in the same manner as the term "comprising" is open ended.

The example program 400 of FIG. 4 begins at block 410, when the example write controller 155 receives a write request from the host 115 via the host interface 120. The example ratio determiner 140 calculates a ratio representative of a percentage of data to be written to a first memory type of the solid state drive. (Block 420). In examples disclosed herein, the example ratio determiner calculates the ratio based on a desired host speed of the SSD 110. However, the ratio may be calculated in any other fashion.

In response to receiving the request to write data, the example write controller 155 determines, based on the ratio calculated by the example ratio determiner 140, a first portion of the data to be written to the first memory type of the SSD 110. (Block 430). In the illustrated example of FIG. 4, the incoming request to write data is broken into smaller portions for writing. The example write controller 155 determines a second portion of the data to be written to a second memory type of the SSD 110. (Block 440). In examples disclosed herein, the first memory type of the SSD 110 is the fast memory 171, 172, 173. In examples disclosed herein, the second memory type of the SSD 110 is the slow memory 181, 182, 183. In examples disclosed herein, the second portion of the data represents a remainder of the data not included in the first portion of the data.

In examples disclosed herein, the first memory type (e.g., the SLC memory) has a greater write bandwidth than the second memory type (e.g., the MLC memory). In addition, writing some of the incoming of the incoming write requests to the second memory type (e.g., the MLC memory) extends the period of increased performance when writing data to the SSD 110 because a portion of the incoming data is not written to the first memory type (e.g., the SLC memory) during the period of increased performance. Furthermore, an effective life of the first memory type (e.g., the SLC memory) is extended, as less write operations are directed to the first memory type (e.g., the SLC memory) in response to incoming data.

The example write controller 155 causes the write arbiter 160 to write the first portion of the data to the first memory type of the solid state drive. (Block 450). The example write controller 155 causes the write arbiter 160 to write the second portion of the data to the second memory type of the solid state drive. (Block 460). The example process 400 of FIG. 4 is repeated upon receipt of each received request to write data. However, the example process 400 of FIG. 4 may be executed in any fashion. For example, the example process 400 may be performed in parallel with respect to multiple received requests to write data.

Figure 5:
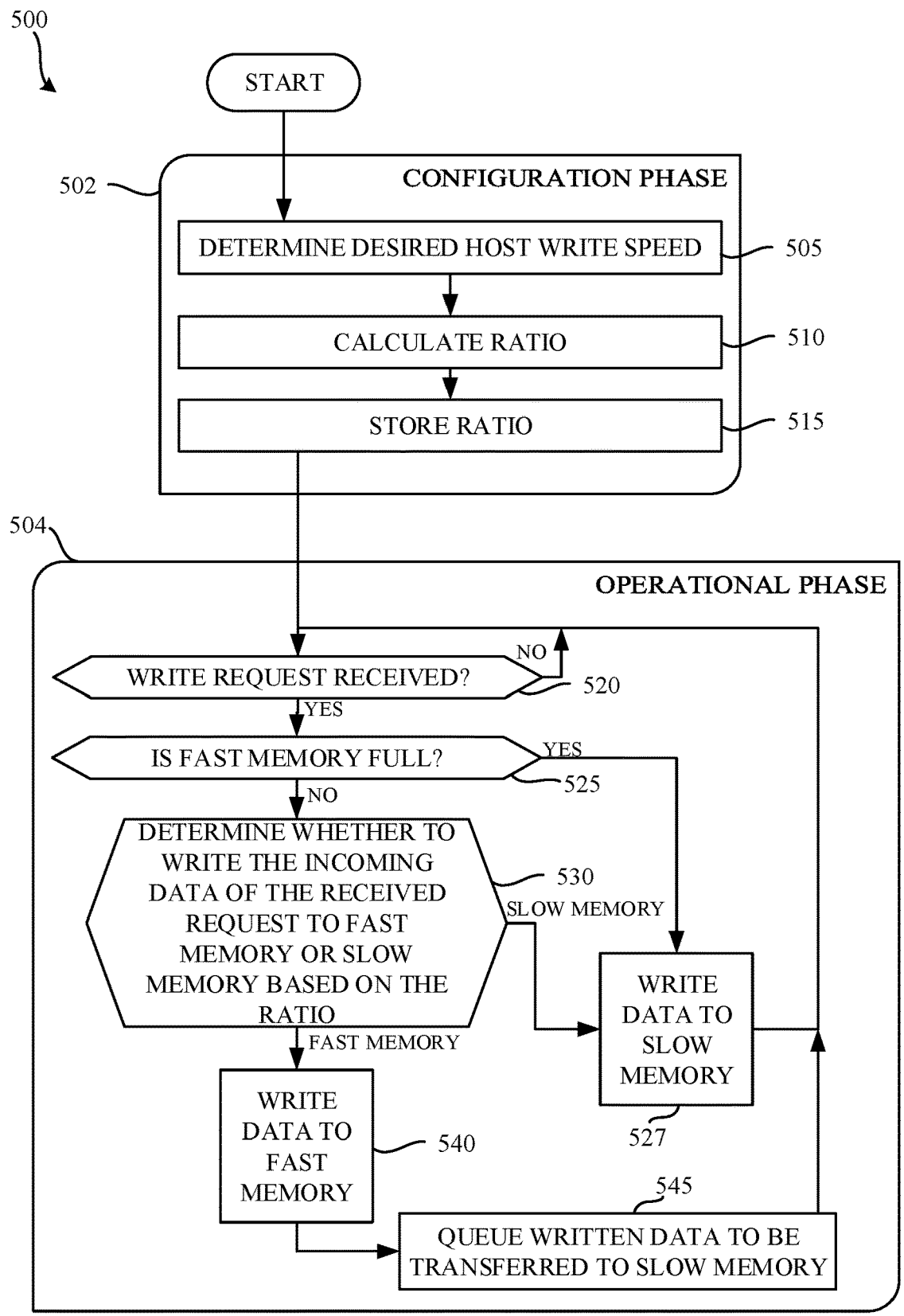
FIG. 5 is an alternative flowchart representative of example machine-readable instructions which, when executed, cause the example solid state drive of FIG. 1 to extend a period of increased performance when writing data.

The example program 500 of FIG. 5 includes two phases and represents an alternative approach to implementing the example memory controller 125 of FIG. 1. In the illustrated example of FIG. 5, a configuration phase 502 is implemented to determine and store a ratio. In an operational phase 504, the calculated ratio is used when servicing incoming requests to write data. In the illustrated example, the configuration phase 502 is implemented periodically (e.g., every hour, every day, etc.) However, the example configuration phase 502 may be executed in response to an event such as, for example, upon manufacture of the SSD 110, upon a power-on event of the SSD 110.

In the configuration phase 502, the example host rate identifier 135 of the illustrated example of FIG. 1 identifies a desired host bandwidth. (Block 505). In some examples, the host rate identifier 135 interacts with and/or monitors interactions of the host 115 to identify a level of capability of the host 115 to identify the desired host rate. In some examples, the desired host rate is stored in a memory (e.g., the ratio store 145) of the SSD 110. The example ratio determiner 140 calculates a ratio representative of a percentage of data to be written to a first memory type of the solid state drive. (Block 510). In the illustrated example, the ratio is calculated based on the desired host speed, a rate at which the first memory type (e.g., the SLC memory) is written, and a rate at which a second memory type (e.g., the MLC memory) is written. However, any other factors may additionally or alternatively be used. The example ratio determiner 140 stores the ratio in the example ratio database 145. (Block 515).

The example memory controller 125 then enters the operational phase 504. In the operational phase 504, requests to write data are received from the host 115 via the host interface 120. The example write controller 155 monitors the host interface 120 to identify if a write request that has not yet been processed has been received. (Block 520). If no write request has been received (Block 520 returns a result of NO), the example write controller 155 continues to monitor the host interface until a write request is received. (Bock 520). If a write request is received (Block 520 returns a result of YES), the example write controller 155 communicates with the buffer controller 150 to identify whether the fast memory 171, 172, 173 is full. (Block 525). The fast memory may be full if, for example, data has been written to all sectors of the fast memory 171, 172, 173. If the fast memory 171, 172, 173 is full, (Block 525 returns a result of YES), the example write controller 155 instructs the example write arbiter 160 to write the data to the slow memory 181, 182, 183. (Block 527). The example memory controller 125 then waits for subsequent write requests. (Block 520).

If the fast memory 171, 172, 173 is not full (Block 525 returns a result of NO), the example write controller 155 determines, based on the ratio calculated by the ratio determiner 140 at Block 510, whether to write the incoming data request to the fast memory 171, 172, 173 or the slow memory 181, 182, 183. (Block 530). In contrast to the approach disclosed in connection with FIG. 4, in the illustrated example of FIG. 5, incoming write requests are routed in whole to either the fast memory 171, 172, 173 or the slow memory 181, 182, 183. For example, the example write controller 155 may determine that four of every five incoming requests are to be written to the fast memory. However, any other approach to determining whether to write the data to the fast memory or slow memory may additionally or alternatively be used.

If the example write controller 155 determines that the data should be written to the fast memory (Block 530), the example write controller 155 instructs the write arbiter 160 to write the data to the fast memory 171, 172, 172 of a memory instance. (Block 540). The example write controller 155 then interacts with the buffer controller 150 to queue the data written to the fast memory 171, 172, 173 to be written to the slow memory 181, 182, 183. (Block 545). When the write arbiter 160 is available (e.g., when the burtsy write period has ended), the example buffer controller 150 instructs the write arbiter 160 to write data stored in the fast memory 171, 172, 173 to the slow memory 181, 182, 183. The fast memory is then freed for storage of incoming data. The example write controller 155 then monitors for an incoming write request (Block 520), and the operational phase 504 of FIG. 5 continues.

Returning to block 530, if the example write controller 155 determines that the data should be written to the slow memory (Block 530), the example write controller 155 instructs the write arbiter 160 to write the data to the slow memory 181, 182, 183. The example write arbiter 160 communicates with the example memory instance 131, 132, 133 to write the data to the corresponding slow memory 181, 182, 183. The example write controller 155 then monitors for an incoming write request (Block 520), and the operational phase 504 of FIG. 5 continues.

Figure 6:
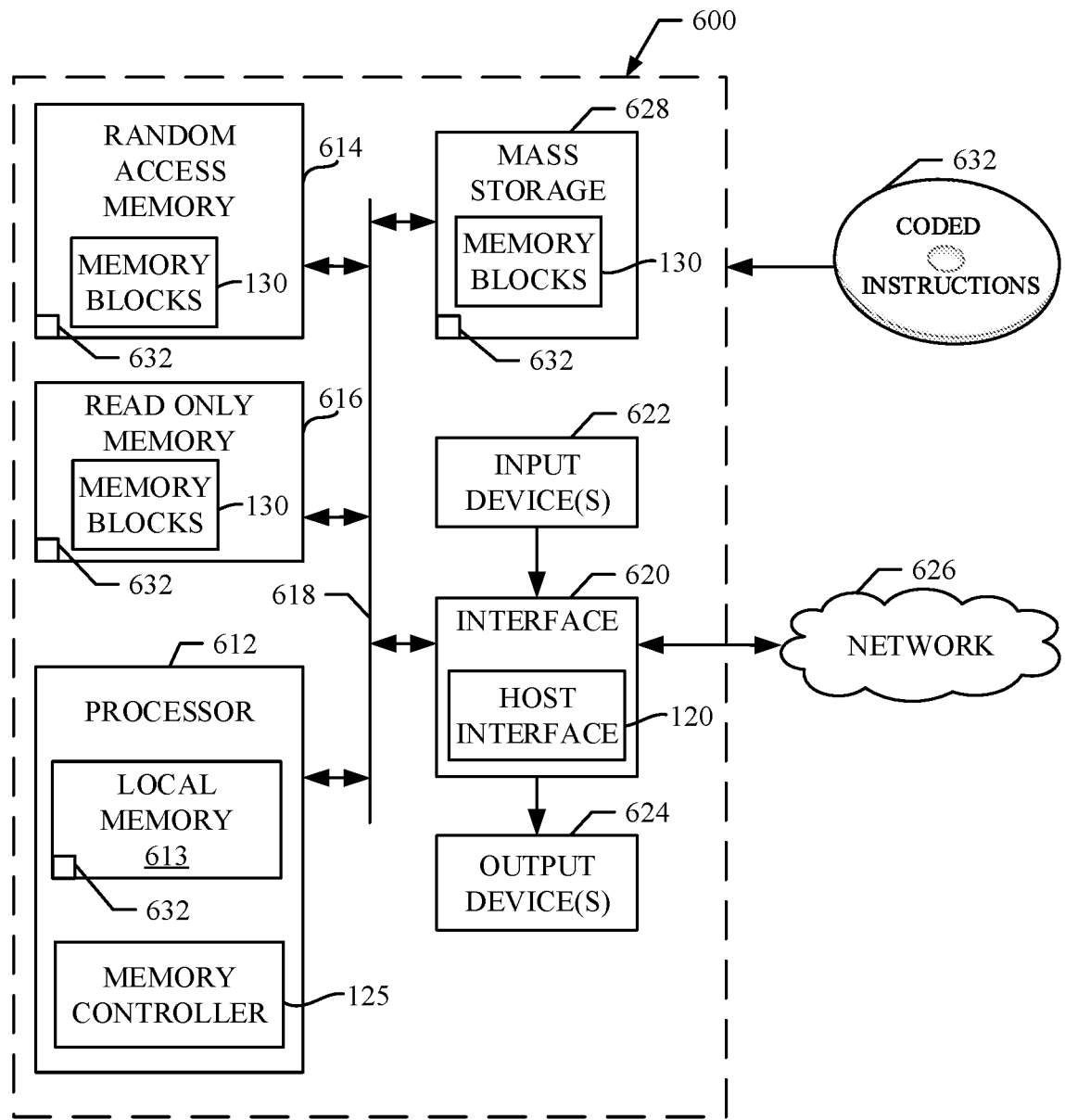
FIG. 6 is a block diagram of an example processor platform 600 capable of executing the instructions of FIGS. 4 and/or 5 to implement the example solid state drive of FIG. 1.

FIG. 6 is a block diagram of an example processor platform 600 capable of executing the instructions of FIGS. 4 and/or 5 to implement the example SSD 110 of FIG. 1. The processor platform 600 can be implemented as a part of, for example, a server, a network attached storage (NAS) device, a storage area network (SAN) device, a personal computer, a mobile device (e.g., a cell phone, a smart phone, a tablet such as an iPad™), a personal digital assistant (PDA), an Internet appliance, a digital video recorder, a gaming console, a personal video recorder, a set top box, or any other type of computing device.

The processor platform 600 of the illustrated example includes a processor 612 that executes instructions to implement the example memory controller 125 of FIG. 1. The processor 612 of the illustrated example is hardware. For example, the processor 612 can be implemented by one or more integrated circuits, logic circuits, microprocessors or controllers from any desired family or manufacturer.

The processor 612 of the illustrated example includes a local memory 613 (e.g., a cache). The processor 612 of the illustrated example is in communication with a main memory including a volatile memory 614 and a non-volatile memory 616 via a bus 618. The volatile memory 614 may be implemented by Synchronous Dynamic Random Access Memory (SDRAM), Dynamic Random Access Memory (DRAM), RAMBUS Dynamic Random Access Memory (RDRAM) and/or any other type of random access memory device. The non-volatile memory 616 may be implemented by flash memory and/or any other desired type of memory device. Access to the main memory 614, 616 is controlled by a memory controller. In the illustrated example of FIG. 6, the main memory may implement the example memory blocks 130 of FIG. 1.

The processor platform 600 of the illustrated example also includes an interface circuit 620. The interface circuit 620 may be implemented by any type of interface standard, such as an Ethernet interface, a universal serial bus (USB), and/or a PCI express interface. In the illustrated example of FIG. 6, the interface circuit 620 implements the example host interface 120.

In some examples, the processor platform 600 may execute a virtual computing environment. For example, one or more virtual processing cores may be provided by the example processor 612. In some examples, one or more virtual network interfaces (e.g., vNICs) may be provided by the example interface circuit 620. In some examples, the example virtual computing environment may be utilized to extend a period of increased performance when writing data to a solid state drive using examples disclosed herein.

In the illustrated example, one or more input devices 622 are connected to the interface circuit 620. The input device(s) 622 permit(s) a user to enter data and commands into the processor 612. The input device(s) can be implemented by, for example, a button, a selector switch, or a jumper pin.

One or more output devices 624 are also connected to the interface circuit 620 of the illustrated example. The output devices 624 can be implemented, for example, by display devices (e.g., a light emitting diode (LED), an organic light emitting diode (OLED), etc.). In some examples, the interface circuit 620 of the illustrated example includes a graphics driver card, a graphics driver chip or a graphics driver processor.

The interface circuit 620 of the illustrated example also includes a communication device such as a transmitter, a receiver, a transceiver, a serial communicator (e.g., a universal serial bus port), a Parallel Advanced Technology Attachment (PATA) interconnect, a Small Computer System Interface (SCSI) interconnect, a Serial-Attached SCSI (SAS) interconnect, a Serial Advanced Technology Attachment (SATA) and/or network interface card to facilitate exchange of data with external machines (e.g., computing devices of any kind).

The processor platform 600 of the illustrated example also includes one or more mass storage devices 628 for storing software and/or data. Examples of such mass storage devices 628 include not and (NAND) logic gates, Synchronous Dynamic Random Access Memory (SDRAM), Dynamic Random Access Memory (DRAM), RAMBUS Dynamic Random Access Memory (RDRAM), 3D crosspoint memory, and/or any other type of data storage device. The example mass storage devices 628 of FIG. 6 may implement the memory blocks 130 of FIG. 1.

The coded instructions 632 of FIGS. 4 and/or 5 may be stored in the mass storage device 628, in the volatile memory 614, in the non-volatile memory 616, and/or on a removable tangible computer readable storage medium such as a CD or DVD.

From the foregoing, it will be appreciated that the above disclosed methods, apparatus and articles of manufacture extend a period of increased performance when writing data in a solid state drive. In examples disclosed herein, by writing portions of incoming data to different memory types, the duration of a period of increased performance is extended as compared to writing all of the incoming data to the fastest available memory type.

As disclosed herein, storage (e.g., NAND flash memory) has a limited lifespan. As such, memory cells (e.g., NAND flash memory cells) will become unusable after a number of writes occur to that memory cell. In examples disclosed herein, an effective life of the first memory type (e.g., the SLC memory) is extended, as less write operations are directed to the first memory type (e.g., the SLC memory) in response to incoming data.

Examples may include subject matter such as a method, means for performing acts of the method, at least one machine-readable medium including instructions that, when performed by a machine cause the machine to performs acts of the method, or of an apparatus or system to optimize instructions for execution by a processor according to embodiments and examples described herein.

Example 1 is an apparatus. The apparatus of Example 1 comprises a non-volatile memory including a first memory having a first write rate and a second memory having a second write rate, the first write rate greater than the second write rate. The apparatus of Example 1 further includes a controller to, in response to receiving a request to write data, determine, based on a ratio, a first portion of the data to be written to the first memory, and a second portion of the data to be written to the second memory, the second portion of the data not included in the first portion of the data.

Example 2 includes the subject matter of Example 1, wherein the first memory stores one bit per cell.

Example 3 includes the subject matter of any one of Examples 1-2, wherein the second memory stores multiple bits per cell.

Example 4 includes the subject matter of any one of Examples 1-3, wherein the second memory stores three bits per cell.

Example 5 includes the subject matter of any one of Examples 1-4, wherein writing the second portion of the data to the second memory extends a period of increased performance when writing data to the solid state drive by diverting a percentage of the data away from the first memory.

Example 6 includes the subject matter of any one of Examples 1-5, and further includes a buffer controller to queue the first portion of the data written to the first memory to be written to the second memory.

Example 7 includes the subject matter of any one of Examples 1-6, wherein the controller is further to determine that the first portion of the data is to be written to the second memory when the first memory is full.

Example 8 includes the subject matter of any one of Examples 1-7, and further includes a host rate identifier to determine a desired write rate, the ratio based on the desired write rate.

Example 11 is a method of writing data in a solid state drive. The method of Example 11 comprises in response to receiving a request to write data, determining, based on a ratio, a first portion of the data to be written to a first memory type, and a second portion of the data to be written to a second memory type, the second portion of the data not included in the first portion of the data, the first memory having a first write rate and the second memory having a second write rate, the first write rate greater than the second write rate. The method of Example 11 includes writing the first portion of the data to the first memory. The method of Example 11 includes writing the second portion of the data to the second memory.

Example 12 includes the subject matter of Example 11, wherein the first memory stores one bit per cell.

Example 13 includes the subject matter of any one of Examples 11-12, wherein the second memory stores multiple bits per cell.

Example 14 includes the subject matter of any one of Examples 11-13, wherein the second memory stores three bits per cell.

Example 15 includes the subject matter of any one of Examples 11-14, wherein writing the second portion of the data to the second memory extends a period of increased performance when writing data to the solid state drive by diverting a percentage of the data away from the first memory.

Example 16 includes the subject matter of any one of Examples 11-15, and further includes queuing the first portion of the data written to the first memory to be written to the second memory.

Example 17 includes the subject matter of any one of Examples 11-16, and further includes determining that the first portion of the data is to be written to the second memory when the first memory is full.

Example 18 includes the subject matter of any one of Examples 11-17, further including calculating the ratio by determining a desired write rate, the ratio based on the desired write rate.

Example 19 is a tangible machine-readable storage medium comprising instructions which, when executed, cause a solid state drive (SSD) to in response to receiving a request to write data, the determine, based on a ratio, a first portion of the data to be written to the first memory, and a second portion of the data to be written to the second memory, the second portion of the data not included in the first portion of the data. The instructions of Example 17, when executed, cause the SSD to write the first portion of the data to the first memory. The instructions of Example 17, when executed, cause the SSD to write the second portion of the data to the second memory.

Example 20 includes the subject matter of Example 19, wherein the first memory stores one bit per cell.

Example 21 includes the subject matter of any one of Examples 19-20, wherein the second memory stores multiple bits per cell.

Example 22 includes the subject matter of any one of Examples 19-21, wherein the second memory stores three bits per cell.

Example 23 includes the subject matter of any one of Examples 19-22, wherein writing the second portion of the data to the second memory extends a period of increased performance when writing data to the solid state drive by diverting a percentage of the data away from the first memory.

Example 24 includes the subject matter of any one of Examples 19-23, wherein the instructions, when executed, further cause the SSD to queue queuing the first portion of the data written to the first memory to be written to the second memory.

Example 25 includes the subject matter of any one of Examples 19-24, wherein the instructions, when executed, further cause the SSD to determine that the first portion of the data is to be written to the second memory when the first memory is full.

Example 26 includes the subject matter of any one of Examples 19-25, wherein the instructions, when executed, further cause the SSD to calculate the ratio by determining a desired write rate, the ratio based on the desired write rate.

Example 27 is an apparatus comprising a non-volatile memory means including a first memory having a first write rate and a second memory having a second write rate, the first write rate greater than the second write rate. The apparatus of Example 25 includes means for determining, in response to receiving a request to write data, based on a ratio, a first portion of the data to be written to the first memory, and a second portion of the data to be written to the second memory. The second portion of the data not included in the first portion of the data.

Example 28 includes the subject matter of any one of Example 27, wherein the first memory stores one bit per cell.

Example 29 includes the subject matter of any one of Examples 27-28, wherein the second memory stores multiple bits per cell.

Example 30 includes the subject matter of any one of Examples 27-29, wherein the second memory stores three bits per cell.

Example 31 includes the subject matter of any one of Examples 27-30, wherein writing the second portion of the data to the second memory extends the period of increased performance when writing data to the solid state drive by diverting a percentage of the data away from the first memory.

Example 32 includes the subject matter of any one of Examples 27-31, and further includes means for queuing the first portion of the data written to the first memory to be written to the second memory.

Example 33 includes the subject matter of any one of Examples 27-32, wherein the means for determining is further to determine that the first portion of the data is to be written to the second memory when the first memory is full.

Example 34 includes the subject matter of any one of Examples 27-33, and further includes means for determining a desired write rate, the ratio based on the desired write rate.

Example 35 includes the subject matter of any one of Examples 27-34, and further includes means for determining the ratio representative of a percentage of data to be written to the first memory, the first memory and the second memory being included in a same memory instance.

Example 36 includes the subject matter of any one of Examples 27-35, and further includes means for writing the first portion of the data to the first memory, the means for writing to write the second portion of the data to the second memory.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent.

What is claimed is:

1. A system comprising:
first memory having a first write rate;
second memory having a second write rate, the first write rate greater than the second write rate;
a rate identifier to detect a desired data transmission rate;
a ratio determiner to determine a ratio based on the desired data transmission rate, the first write rate, and the second write rate;
a controller to, in response to a request to write data, identify, based on the ratio, a first portion of the data to be written to the first memory, and a second portion of the data to be written to the second memory, the second portion of the data not included in the first portion of the data, the controller to cause the first portion of the data to be written to the first memory and the second portion of the data to be written to the second memory, the controller to detect completion of a write period when an amount of data to be written has dropped below a threshold representing an amount of data to be written, the controller to, in response to detection of completion of the write period and the first portion of the data having been written to the first memory, continue to write the second portion of the data to the second memory and cause a buffer controller to write the first portion of the data to the second memory.

2. The system of claim 1, wherein the first memory is implemented using 3D crosspoint memory.

3. The system of claim 2, wherein the second memory is implemented using NAND flash memory.

4. The system of claim 1, wherein the first memory and the second memory are implemented in a same memory instance.

5. The system of claim 1, wherein the second portion of the data is to be written to the second memory to extend a period of increased performance when writing the data by diverting a percentage of the data away from the first memory.

6. The system of claim 1, further including the buffer controller to cause the first portion of the data, once written to the first memory, to be written to the second memory.

7. The system of claim 1, wherein the controller is further to determine that the first portion of the data is to be written to the second memory when the first memory is full.

8. The system of claim 1, wherein the ratio is representative of a percentage of data to be written to the first memory.

9. The system of claim 1, further including a write arbiter to write the first portion of the data to the first memory, the write arbiter to write the second portion of the data to the second memory.

10. A non-transitory machine-readable medium comprising instructions which, when executed, cause at least one processor to at least:
  detect a desired data transmission rate;
  determine a ratio representative of a percentage of data to be written to a first memory, the ratio based on the desired data transmission rate, a first write rate of the first memory, and a second write rate of a second memory, the first write rate greater than the second write rate;
  in response to a request to write data, select, based on the ratio, a first portion of the data to be written to the first memory, and a second portion of the data to be written to the second memory, the second portion of the data not included in the first portion of the data;
  write the first portion of the data to the first memory;
  write the second portion of the data to the second memory;
  detect completion of a write period when an amount of data to be written drops below a threshold representing an amount of data to be written; and
  cause, in response to the detection of the completion of the write period and the first portion of the data having been written to the first memory, the first portion of the data to be rewritten to the second memory and the second portion of the data to continue to be written to the second memory.

11. The machine-readable medium of claim 10, wherein the first memory is implemented using 3D crosspoint memory.

12. The machine-readable medium of claim 11, wherein the second memory is implemented using NAND flash memory.

13. The machine-readable medium of claim 10, wherein writing the second portion of the data to the second memory extends a period of increased performance when writing the data by diverting a percentage of the data away from the first memory.

14. The machine-readable medium of claim 10, wherein the instructions, when executed, further cause the at least one processor to determine that the first portion of the data is to be written to the second memory when the first memory is full.

15. The machine-readable medium of claim 10, wherein the instructions, when executed, further cause the at least one processor to write the second portion of the data to the second memory.

16. A system comprising:
  3D crosspoint memory;
  NAND flash memory;
  a rate identifier to detect a desired data transmission rate;
  a ratio determiner to determine a ratio based on the desired data transmission rate, a first write rate of the 3D crosspoint memory, and a second write rate of the NAND flash memory;
  a controller to, in response to a request to write data, determine, based on the ratio, a first portion of the data to be written to the 3D crosspoint memory, and a second portion of the data to be written to the NAND flash memory, the second portion of the data not included in the first portion of the data, the controller to cause the first portion of the data to be written to the 3D crosspoint memory and to cause the second portion of the data to be written to the NAND flash memory, the controller to detect completion of a write period when an amount of data to be written has dropped below a threshold representing an amount of data to be written, the controller to, in response to detection of completion of the write period and the first portion of the data having been written to the 3D crosspoint memory, continue to write the second portion of the data to the NAND flash memory and cause a buffer controller to write the first portion of the data to the NAND flash memory.

17. The system of claim 16, further including the buffer controller to cause the first portion of the data, once written to the 3D crosspoint memory, to be written to the NAND flash memory.

18. The system of claim 16, wherein the second portion of the data is to be written to the NAND flash memory to extend a period of increased performance when writing the data by diverting at least a portion of the data away from the 3D crosspoint memory.

19. The system of claim 16, wherein the controller is further to determine that the first portion of the data is to be written to the NAND flash memory when the 3D crosspoint memory is full.

* * * * *